United States Patent [19]
Ota

[11] Patent Number: 5,646,552
[45] Date of Patent: Jul. 8, 1997

[54] DATA TRANSMISSION DEVICE USED TOGETHER WITH SYSTEM INTERFACE HAVING IMPROVED DATA TRANSMISSION PERFORMANCE

[75] Inventor: Shuichi Ota, Yokohama, Japan

[73] Assignee: Ricoh Company, Ltd., Tokyo, Japan

[21] Appl. No.: 105,069

[22] Filed: Aug. 12, 1993

[30] Foreign Application Priority Data

Aug. 14, 1992 [JP] Japan .................................. 4-237626

[51] Int. Cl.⁶ ............................................ H03K 19/0175
[52] U.S. Cl. ............................ 326/86; 326/30; 326/90
[58] Field of Search .............................. 326/21, 86, 90, 326/30, 62, 80

[56] References Cited

U.S. PATENT DOCUMENTS 4,987,319  1/1991  Kawana .......................... 326/86
5,136,187  8/1992  Ceccherelli et al. .................. 326/90
5,374,858  12/1994  Elmer ............................ 326/90
5,438,281  8/1995  Takahashi et al. .................. 326/86

FOREIGN PATENT DOCUMENTS 60-200617  10/1985  Japan ............................ 326/86
63-240124  10/1988  Japan ............................ 326/86

Primary Examiner—Edward P. Westin
Assistant Examiner—Jon Santamauro
Attorney, Agent, or Firm—Oblon, Spivak, McClelland, Maier & Neustadt, P.C.

[57] ABSTRACT

The data transmission device is used for transmitting data sent from a first apparatus to a second apparatus through a system interface and/or for receiving data sent from the second apparatus to the first apparatus through the system interface. The data transmission device comprises a cutting off unit for substantially cutting off a path between the first apparatus and the system interface while a signal being output from the first apparatus has a first predetermined signal level.

12 Claims, 7 Drawing Sheets

DATA TRANSMISSION DEVICE USED TOGETHER WITH SYSTEM INTERFACE HAVING IMPROVED DATA TRANSMISSION PERFORMANCE

BACKGROUND OF THE INVENTION

The present invention relates to a data transmission device used together with a system interface such as a single-end type Small Computer System Interface (referred to as "SCSI" hereinafter) interface-bus connected in a so-called daisy chain type connection. In the system using such a transmission device together with a system interface, one apparatus transmits data to and/or data from another apparatus through the system interface.

SCSI is a standard high-speed parallel interface defined by the X3T9.2 committee of the American National Standard Institute (ANSI).

The term "daisy chain" means a set of devices connected in a series. When devices are daisy-chained to a microcomputer, the first device is connected to the computer, the second device is connected to the first, and so on down to the line. Signals are passed through the chain from one device to the next.

In an example of a small-scale computer system such as a personal computer system, such a system interface as SCSI is used to connect a host apparatus with peripheral system such as an external storing apparatus.

By utilizing a SCSI, as mentioned above, relatively high-speed data transferring is enabled. Further, by utilizing a SCSI in data transferring among several units/devices, various useful functions thereof may be utilized. Furthermore, effecting a single end type connection with a connection manner associated with the SCSI interface bus may simplify a composition of a system associated with the SCSI interface bus.

Such a computer system using SCSI for data transferring has a drawback that may appear when high-speed data transmission is executed through such a single-end type SCSI interface bus. This drawback consists of an insufficient signal level associated with a signal carried through the SCSI interface bus. This insufficient signal level results from the following causes. A first cause is an input capacity of a transistor included in a receiver unit. This receiver unit is used for inputting data from the SCSI interface bus. The second cause is a stray capacity of a printed circuit board which comprises circuits used to realize the function of the SCSI interface bus. The insufficient signal level may disable appropriate data transmission.

SUMMARY OF THE INVENTION

An object of the present invention is to provide a data transmission device by use of which occurrence of such an insufficient signal level is prevented.

To achieve the object of the present invention, the data transmission device according to the present invention comprises cutting off means for substantially cutting off a path connecting said first apparatus and said system interface while a signal being output from said first apparatus has a first predetermined signal level.

This cutting off means functions to disconnect a relevant circuit from the SCSI bus. Thus, insufficiency of impedance associated with the SCSI bus is prevented, and an appropriate data transmission is enabled.

Other objects and further features of the present invention will become more apparent from the following detailed description when read in conjunction with the accompanying drawings.

DESCRIPTION OF THE PREFERRED EMBODIMENTS

Figure 1A:
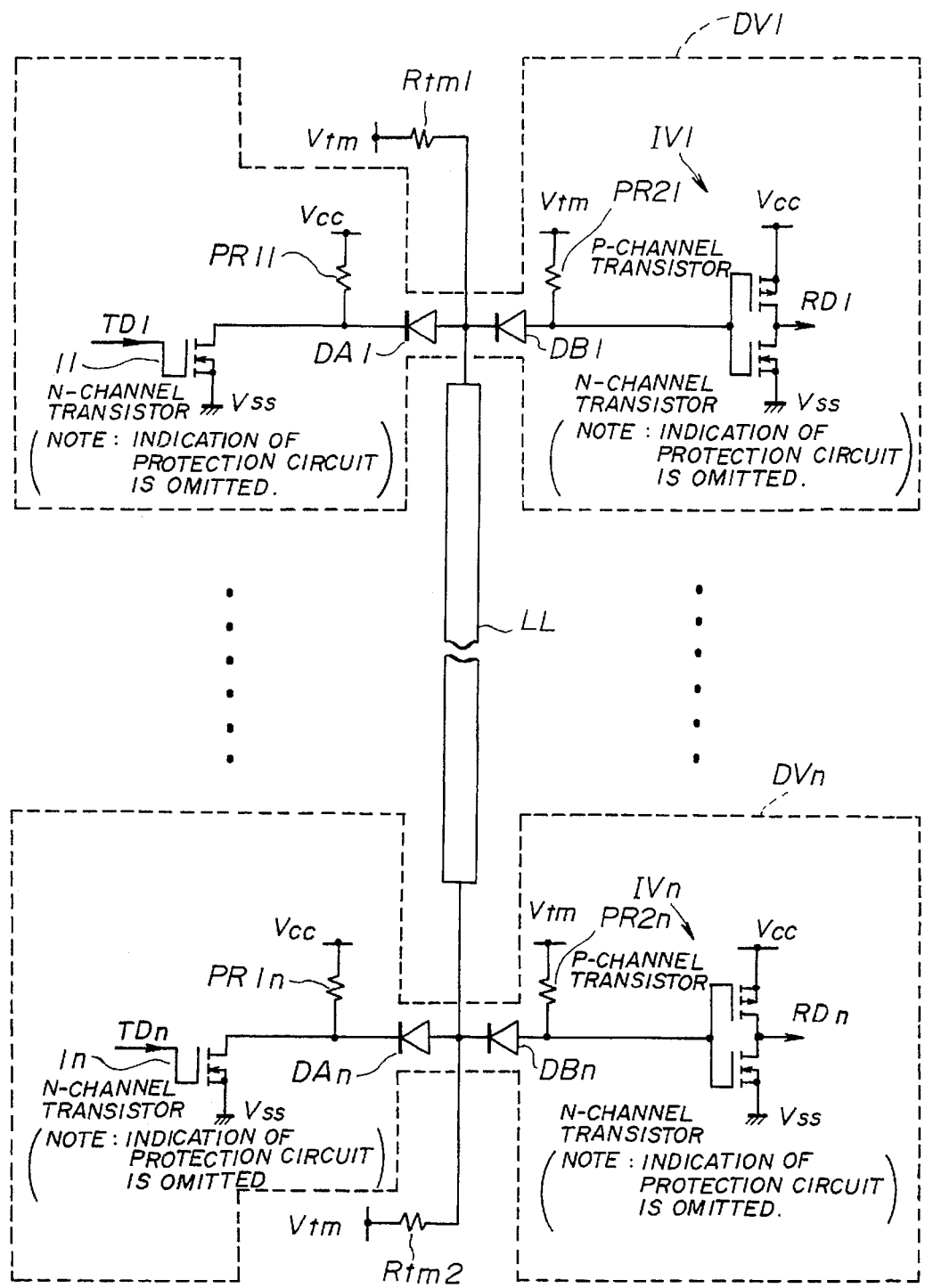
FIG. 1A shows a circuit diagram of a part, relevant to the present invention, of a data transmission device according to a first embodiment of the present invention

The data transmission devices DV1–DVn according to the first embodiment of the present invention will now be described with reference to FIG. 1A.

These data transmission devices DV1–DVn are respectively connected with a single-end type SCSI interface bus connected so as to form a daisy chain. In this connection, the data transmission devices DV1–DVn respectively transmit data to and/or receive data from one another through the SCSI interface bus.

Normally, such a SCSI interface bus comprises 18 lines of signal lines. However, in this description, the transmission devices DV1–DVn will be described concerning only one line LL from among the 18 signal lines, for the sake of simplicity of the description.

The terminal voltage Vtm is respectively applied to the signal line LL via respective terminal resistors Rtm1 and Rtm2. Each of the terminal resistors Rtm1 and Rtm2 has a resistance slightly greater than that of the characteristic impedance of the signal line LL. The characteristic impedance of the signal line LL is, in this example, 100 Ω. The resistance of each of the terminal resistors is, in this example, 110 Ω; and the terminal voltage is, in the example, 2.84 V. The plurality of data transmission devices DV1–DVn are respectively connected with the signal line LL.

The devices DV1–DVn respectively have driver units. The driver units of the devices DV1–DVn are respectively used for sending data TD1–TDn to be transmitted to the signal line LL. The driver units of the devices DV1–DVn respectively comprise field effect transistors (they will be respectively referred to as "FETs") 11–1n. The FETs respectively comprise, in this embodiment, N-channel complementary metal oxide semiconductor (N-channel CMOS) transistors. The FETs 11–1n are respectively connected so as to form so-called open-drain connections thereof.

The data TD1–TDn are respectively applied to the gates of the FETs 11–1n. The sources and the substrate gates of the FETs 11–1n are respectively grounded. The drains of the FETs 11–1n are respectively connected, via respective pulling up resistors PR11–PR1n, with respective voltage sources Vcc for respectively supplying voltage Vcc (in this embodiment, Vcc=5±0.25 V). The voltage Vcc corresponds to a logical level H.

Diodes DA1–DAn are respectively connected between the respective drains of the FETs 11–1n and the signal line LL. In these connections, the forward directions of the diodes DA1–DAn are, respectively, those from the signal line LL to the respective FETs 11–1n.

Further, the devices DV1–DVn respectively have receiver units. The receiver units are respectively used for inputting data RD1–RDn from the signal line LL. The receiver units of the devices DV1–DVn respectively comprise inverters IV1–IVn. Each of the inverters IV1–IVn comprises two combined FETs as shown in FIG. 1. Each two combined FETs comprise a P-channel complementary metal oxide semiconductor (P-channel CMOS) transistor, the source and substrate of which are respectively connected to the voltage source Vcc, and an N-channel complementary metal oxide semiconductor (N-channel CMOS) transistor, the source and substrate of which are respectively grounded. Both the drains of each two combined FETs are connected with each other and provide received data RD1. The input ends of the inverters IV1–IVn are respectively connected, via respective pulling up resistors PR21–PR2n, with voltage sources Vtm for supplying the voltage Vtm corresponding to the logical level H. Each of the input ends of the inverters IV1–IVn comprises a connection between both the gates of the corresponding two combined FETs.

Diodes DB1–DBn are respectively connected between the input ends of the inverters IV1–IVn and the signal line LL. In these connections, the forward directions of the diodes DB1–DBn are respectively those from the respective inverters IV1–IVn to the signal line LL.

Operations to be executed in the data transmission devices DV1–DVn will now be described.

In a case where the device DV1 transmits data TD1, the data TD1 becomes the logical level H. Accordingly, the FET 11 turns on. As a result, the voltage of the drain of the FET 11 becomes the grounded level. Thus, the forward-direction biassing is applied to the diode DA1 and thus the diode DA1 turns on. Thus, electric current flows from the terminal voltage sources Vtm to the ground via the signal line LL, the turning on diode DA1, and the turning on FET 11. Thus, the signal level of the signal line LL becomes the logical L.

In a case where the signal level of the data TD1 is the logical L, the FET 11 is in its turned off state. Consequently, the left side terminal in FIG. 1A of the diode DA1 comes to have a voltage approximately the same as Vcc as a result of electric current instantaneously flowing through the resistance PR11. Thus, the backward-direction biassing is applied to the diode DA1, and thus, diode DA1 is in its turned off state. Hence, the signal level in the signal line LL maintains the terminal voltage Vtm, and thus, the signal level of the signal line LL is the logical level H.

In a case where the signal level of signal line LL is the logical level L, the diode DB1 of the device DV1, for example is in its forward-direction condition. Thus, the diode DB1 is in the turned on state. Thus, electric current flows from the voltage source Vtm to the signal line LL via the pulling up resistor PR21 and then via the turned on diode DB1. Thus, the voltage of the input end of the inverter IV1 drops accordingly. Then, after the voltage of the input end of the inverter IV1 has reached a predetermined threshold voltage as a result of the voltage drop, the output voltage of the inverter IV1, that is, the data RD1 is in the logical level H.

In a case where the signal level of the signal line LL is the logical level H, voltages respectively applied to both end terminals of the diode DB1 respectively become substantially identical to each other. Thus, the diode DB1 assumes the turned off state.

Thus, the voltage of the input end of the inverter IV1 is the voltage Vtm, and the output voltage of the inverter IV, that is the data RD1, is the logical level L.

Consequently, data transfer is performed among the devices DV1–DVn via the signal line LL.

In the above-mentioned construction, the FET 11 and the inverter IV1 are respectively substantially isolated from the line LL as appropriate. Thus, dropping of the signal voltage when the line LL is in the "high" state can be prevented.

Figure 2:
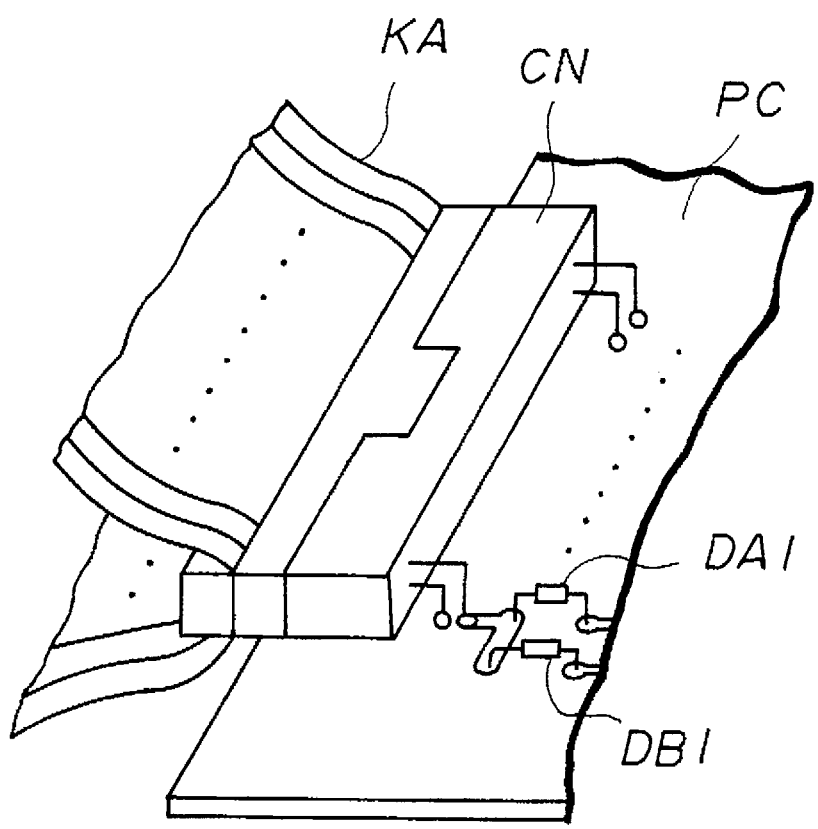
FIG. 2 shows a perspective view of an element installation example concerning circuits shown in FIGS. 1A and 1B.

The installation of the data transmission devices DV1–DVn will now be described with reference to FIG. 2.

According to this installation, the diodes DA1–DAn and DB1–DBn are preferably installed, respectively, adjacent to a connector CN. The connector CN is used for connecting between a printed circuit board PC including the devices DV1–DVn and the SCSI bus cable KA including the signal line LL.

According to this installation, undesired influence caused by a stray capacity of the printed circuit board PC can be reduced.

An experimental comparison between the devices DV1–DVn and the corresponding conventional devices will now be described with reference to FIG. 3.

Figure 3:
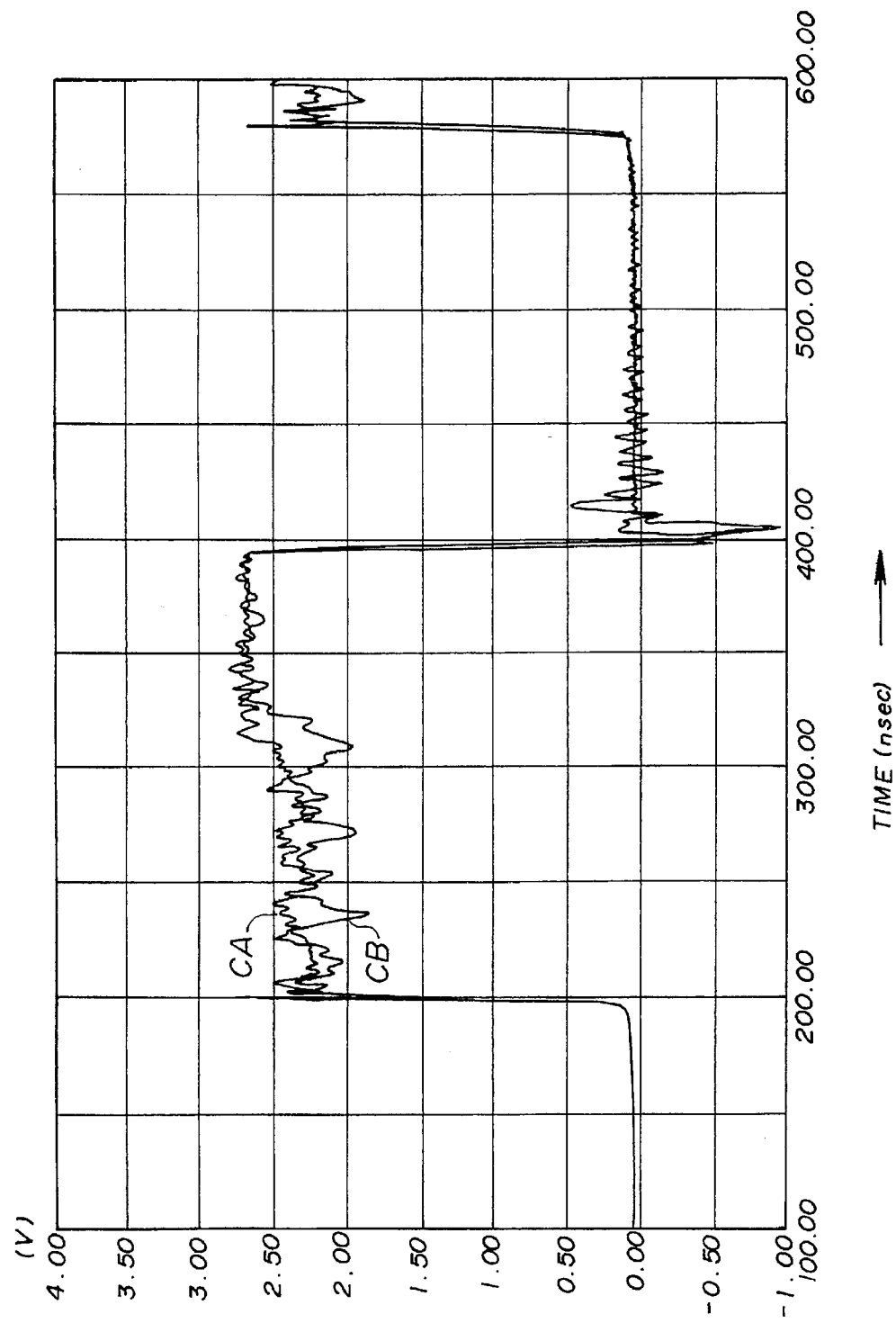
FIG. 3 shows a comparison of signal curves of signals carried through a signal line included in the SCSI bus, using the device shown in FIG. 1A and using a conventional device; the results were obtained from relevant experiments.

The curve CA shown in FIG. 3 shows a signal level of a signal carried through the signal line LL while data is being transmitted among the devices DV1–DVn through the signal line LL.

The curve CB shown in FIG. 3 shows a corresponding signal level using the corresponding conventional devices.

In a comparison between the curves CA and CB, rates of voltage fluctuation occurring when the signal levels are stepped up and when the signal levels are stepped down are smaller in the curve CA than in the curve CB. Thus, a relatively stable data transmission can be performed in the devices DV1–DVn.

Further, in the curve CB, there is a part falling lower than the voltage 2.0 V while the level is generally maintained in the higher position. This voltage 2.0 V is a lower limit threshold voltage of a reference range. If a signal level of the signal carried through the SCSI bus is in the reference range, it is determined that the signal level corresponds to the logical level H. Thus, in the curve CB, that is, in the case of using the conventional devices, the device receiving the signal may mal-determine a signal which is generally maintained in the higher level. Thus, the received signal is to be determined as the logical level H but, as a result of the low part thereof, the device may undesirably determine the signal as the logical level L.

On the other hand, in the devices DV1–DVn according to the first embodiment of the present invention, there is no such part falling lower than the voltage 2.0 V while the level is generally maintained in the higher position. Thus, in the case of using the devices DV1–DVn, a mal-determination such as may be executed by the conventional device receiving the data can be prevented.

The data transmission devices DV1a–DVna according to the second embodiment of the present invention will now be described with reference to FIG. 1B.

In the devices DV1a–DVna, the entire composition is the same as that in the devices DV1–DVn of the above-mentioned first embodiment except for the following difference. The difference is that the transistors 11a14 1na are respectively used in the devices DV1a–DVna instead of the FETs 11–1n respectively used in the devices DV1–DVn. In this replacement, the gate, the drain and the source together with the substrate gate of each FET of the FET 11–1n are respectively replaced by the base, the collector and the emitter of each transistor of the transistors 11a–1na.

The operations in the devices DV1a–DVna are substantially respectively the same as those in the devices DV1–DVn. Thus, other description for the devices DV1a–DVna is omitted.

The data transmission devices ADV1–ADVn according to a third embodiment of the present invention will now be described with reference to FIG. 4A.

Figure 1B:
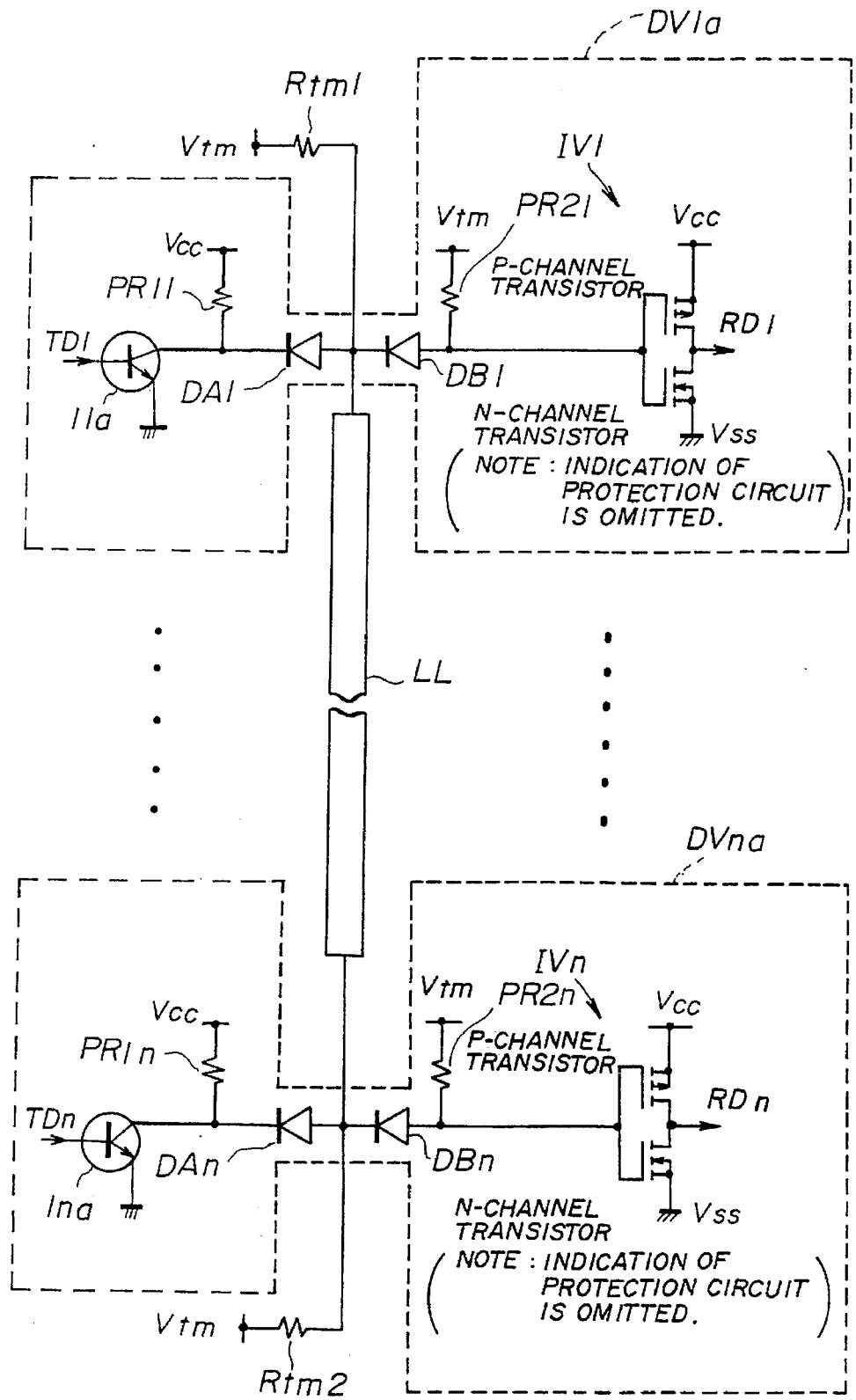
FIG. 1B shows a circuit diagram of a part, relevant to the present invention, of a data transmission device according to a second embodiment of the present invention.
Figure 4A:
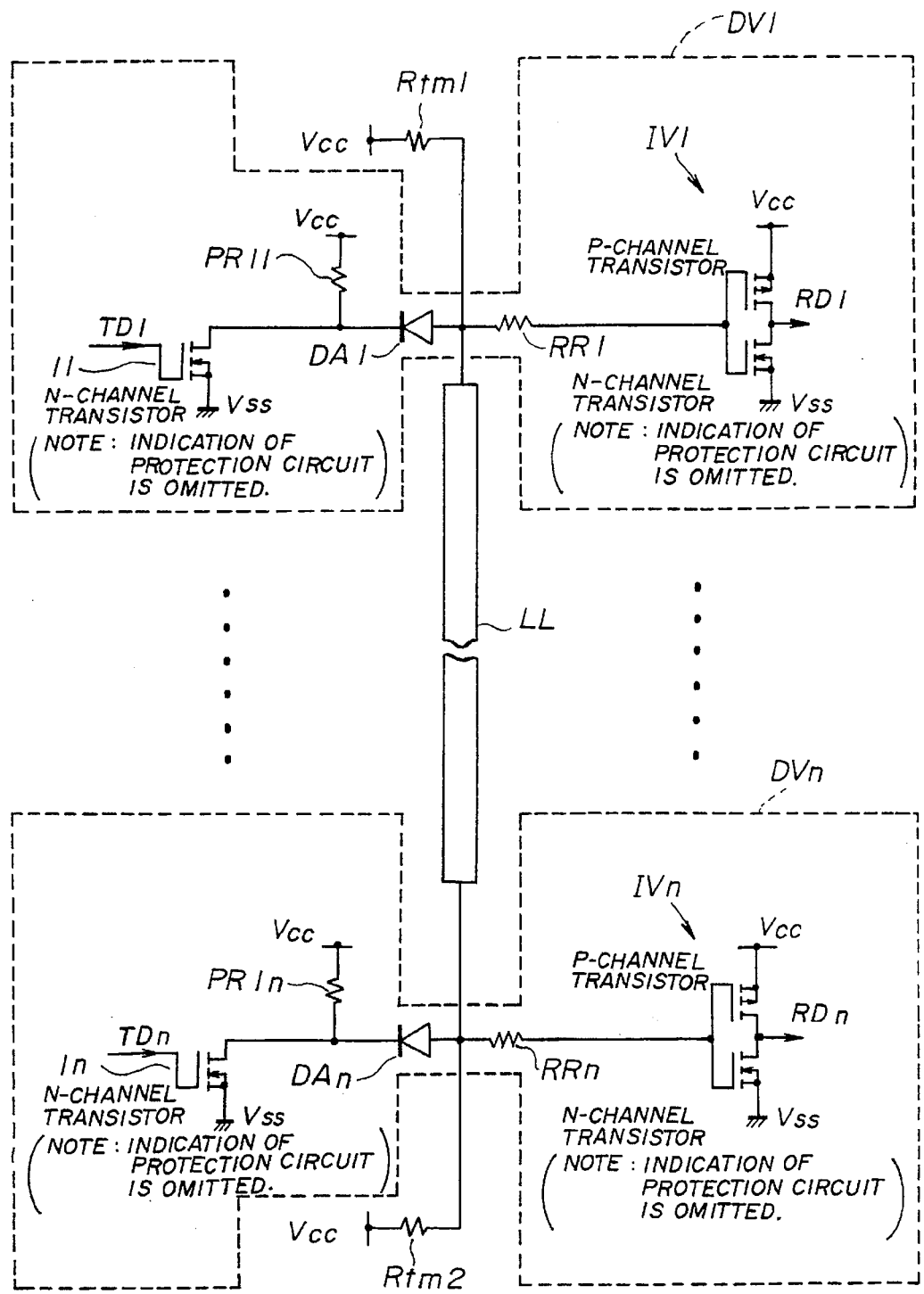
FIG. 4A shows a circuit diagram of a part, relevant to the present invention, of a data transmission device according to a third embodiment of the present invention.

In FIG. 4A, elements substantially the same as or corresponding to those shown in FIG. 1A respectively have the same reference numerals as those of the elements shown in FIG. 1A.

In FIG. 4A, resistors RR1–RRn are respectively connected between the input ends of the inverters IV1–IVn and the signal line LL. Further, the voltage Vtm is applied to both ends of the signal line LL via the terminal resistors Rtm1 and Rtm2 respectively.

A comparison in the devices ADV1–ADVn among cases where various values of resistance are allocated to each of the resistors RR1–RRn will now be described with reference to FIG. 4.

Figure 5:
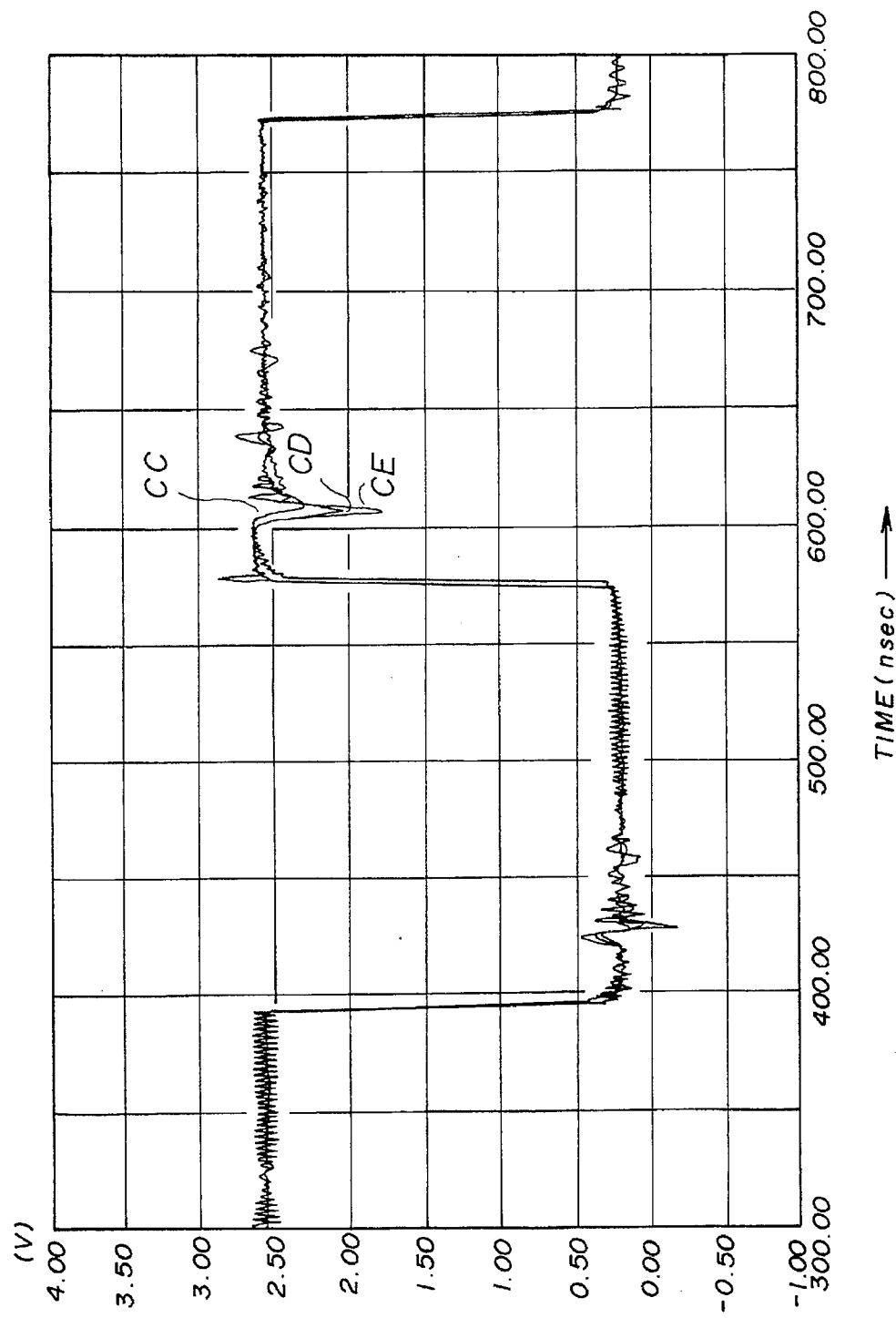
FIG. 5 shows a comparison of signal curves of signals carried through a signal line included in the SCSI bus, using the device shown in FIG. 4A and using a conventional device; the results were obtained from relevant experiment.

The curve CC shown in FIG. 5 shows a signal level of a signal carried through the signal line LL while data is transmitted, via the signal line LL, among the devices ADV1–ADVn. In the devices ADV1–ADVn, the resistors RR1–RRn each has a resistance value of 470 Ω.

The curve CD shown in FIG. 5 shows a signal level of a signal carried through the signal line LL while data is transmitted, via the signal line LL, among the devices ADV1–ADVn. In the devices ADV1–ADVn, the resistors RR1–RRn have a common resistance value of 100 Ω.

The curve CE shown in FIG. 5 shows a signal level of a signal carried through the signal line LL while data is transmitted, via the signal line LL, among the devices ADV1–ADVn. In the devices ADV1–ADVn, the resistors RR1–RRn respectively have a common resistance value of 0 Ω.

A comparison between the cases of the three values of the common resistance being allocated to the resistors RR1–RRn will now be detailed. The signal level fluctuation-range in the curve CE is larger than that of the curve CD, and that of the curve CD is larger than that of the curve CC. Further, in both the curves CC and CD, there is no part falling lower than the voltage 2.6 V while the level is generally maintained in the high position. Thus, in the case of using the devices ADV1–ADVn respectively having the resistors RR1–RRn of the common resistance of 470 Ω or 100 Ω, mal-determination such as mentioned above, which mal-determination may be executed by a conventional device receiving the data, can be prevented.

As a result of the experiment as shown in FIG. 5, it is preferable that the resistors RR1–RRn respectively have respective resistances greater than that of the characteristic impedance of the signal line LL.

Figure 4B:
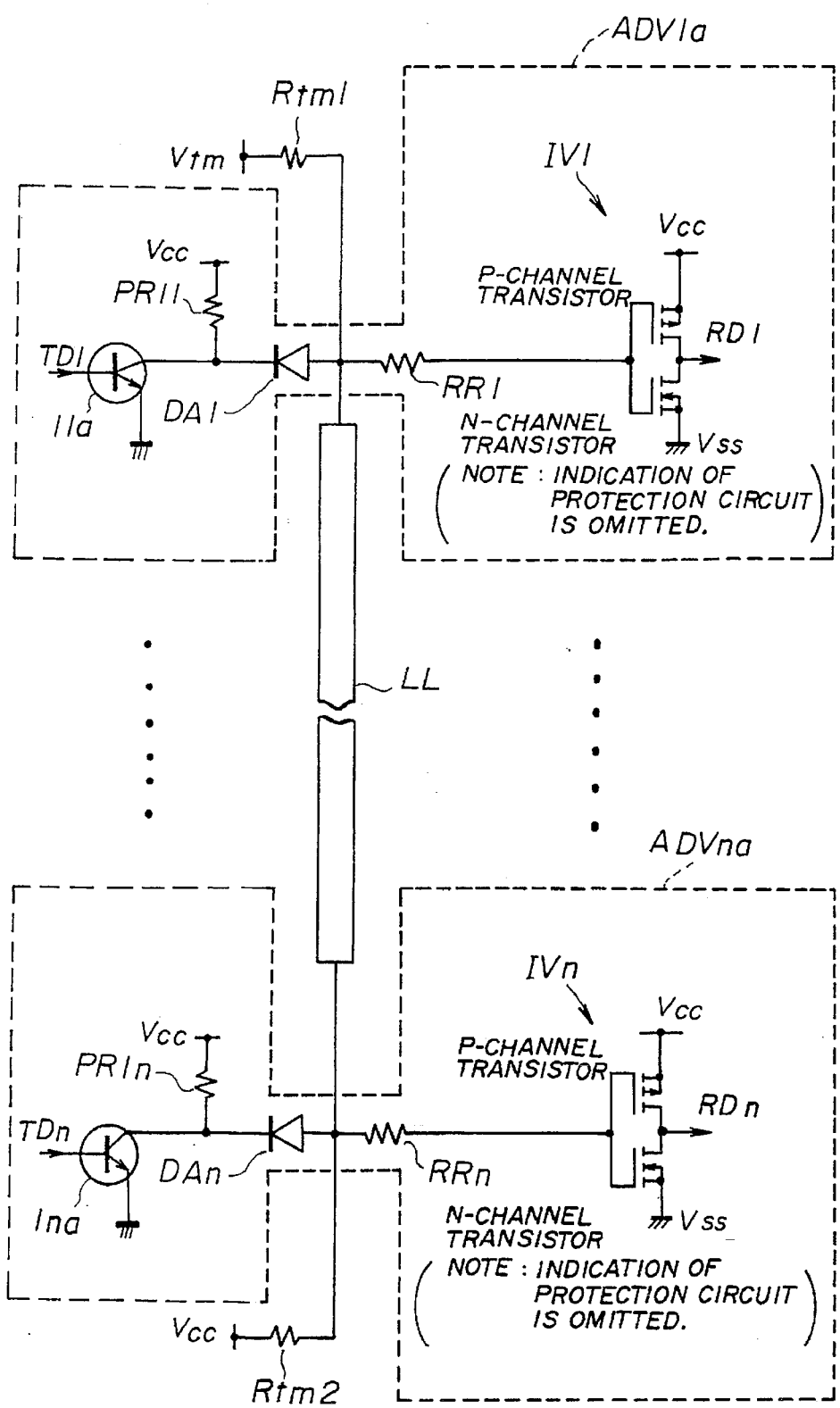
FIG. 4B shows a circuit diagram of a part, relevant to the present invention, of a data transmission device according to a fourth embodiment of the present invention.

The data transmission devices ADV1a–ADVna according to a fourth embodiment of the present invention will now be described with reference to FIG. 4B.

In the devices ADV1a–ADVna, the entire composition is the same as that in the devices ADV1–ADVn of the above-mentioned first embodiment except for the following difference. The difference is that the transistors 11a–1na are respectively used in the devices ADV1a–ADVna instead of the FETs 11–1n respectively used in the devices ADV1–ADVn. In this replacement, the gate, the drain and the source together with the substrate gate of each FET of the FETs 11–1n are respectively replaced by the base, the collector and the emitter of each transistor of the transistors 11a–1na.

The operations in the devices ADV1a–ADVna are substantially respectively the same as those in the devices ADV1–ADVn. Thus, other descriptions for the devices ADV1a–ADVna are omitted.

Thus, by the circuit composition according to the present invention, the driver unit and/or the receiver unit may be substantially disconnected from the SCSI bus. As a result, insufficiency of the impedance associated with the SCSI bus may be prevented. Thus appropriate data transmission may be realized.

Further, the present invention is not limited to the above described embodiments, and variations and modifications may be made without departing from the scope of the present invention.

What is claimed is:

1. A data transmission device used for transmitting data between a first apparatus and a second apparatus through a system interface, said data transmission device comprising cutting off means for substantially cutting off a path connecting said first apparatus and said system interface in response to said system interface assuming a first predetermined signal level, wherein said cutting off means comprises:

first connecting means for connecting said first apparatus and said system interface with said path; and biasing means for biasing said connecting means with a first predetermined voltage; and wherein said first connecting means substantially disconnects said path while said system interface has said first predetermined level; and wherein said biasing means is biasing said first connecting means while said first connecting means substantially cuts said path, the data transmission device further comprising:

second connecting means for providing a signal having a second predetermined voltage to said first apparatus in response to said first connecting means substantially cutting said path; and wherein said second connecting means provides said first predetermined voltage to said first apparatus in response to said first connecting means connecting said path between said first apparatus and said system interface.

2. The data transmission device according to claim 1, wherein:

said first connecting means comprises a first semiconductor device connected between said second connecting means and said system interface;

said biassing means comprises resistance means having a predetermined resistance, and said resistance means is connected between said first semiconductor device and a second voltage source for producing said second predetermined voltage; and said second connecting means comprises a second semiconductor device and a third semiconductor device, wherein said second semiconductor device applies said second predetermined voltage to said third semiconductor device, wherein said third semiconductor device applies, to said second semiconductor device, said first predetermined voltage, and wherein a signal output from said first semiconductor device is supplied to both said second and said third semiconductor devices.

3. A data transmission device used for transmitting data between a first apparatus and a second apparatus through a system interface, wherein said data transmission device comprises cutting off means for substantially cutting off a path connecting said first apparatus and said system interface in response to a signal being output from said first apparatus which has a first predetermined signal level; and wherein said data transmission device comprises resistance means, having a predetermined resistance, for connecting said system interface and said first apparatus, said predetermined resistance being greater than a characteristic impedance of a transmission line comprising said system interface.

4. The data transmission device according to claim 3, wherein said system interface comprises a signal-end type SCSI interface bus forming a daisy chain therewith.

5. An interface connected between a first device and a second device, comprising:

a diode having a first terminal for connection to a bus which is connected to the second device;

a resistor having a first terminal thereof connected to a second terminal of the diode, and having a second terminal thereof connected to a bias voltage source;

a transistor having a first terminal thereof connected to the second terminal of the resistor and the second terminal of the diode, having a second terminal thereof connected to the first device, and having a third terminal thereof connected to one of a ground and a voltage supply.

6. An interface according to claim 5, wherein:

when a signal having a first predetermine level is communicated from the first device to the second terminal of the transistor, the transistor is turned on and the diode permits current from the transistor to substantially pass therethrough to the second device through the bus, and when the signal communicated from the first device has a second predetermined level, the transistor is turned off and voltage from the bias voltage source passes through the resistor to the second terminal of the diode and prevents current from passing through the diode.

7. An interface according to claim 6, wherein:

the transistor is a field effect transistor having the second terminal as a drain and the first terminal as a gate.

8. An interface according to claim 7, wherein:

the third terminal is a source terminal and is connected to ground.

9. An interface according to claim 6, wherein:

the first terminal is a base, the second terminal is a collector, and the third terminal is an emitter.

10. An interface according to claim 5, wherein:

when a signal having a first predetermined level is on the bus, the diode prevents current from the bus from passing therethrough to the first terminal of the transistor, and when a signal having a first predetermine level is on the bus, the diode passes therethrough current from the bus to the transistor.

11. An interface according to claim 10, further comprising:

a second transistor having a drain thereof connected to a drain of said transistor which is the second terminal of said transistor, and having a gate thereof connected to a gate of said transistor which is the first terminal of said transistor.

12. An interface according to claim 11, wherein:

the third terminal of said transistor which is a source terminal is connected to a voltage source, and the third terminal of said second transistor which is a source terminal is connected to the ground.

* * * * *